United States Patent [19]

Daniel

[11] 4,256,829
[45] Mar. 17, 1981

[54] METHOD OF MANUFACTURING SOLID-STATE DEVICES IN WHICH PLANAR DIMENSIONAL DISTORTION IS REDUCED

[75] Inventor: Peter J. Daniel, Dorking, England

[73] Assignee: U.S. Philips Corporation, New York, N.Y.

[21] Appl. No.: 902,291

[22] Filed: May 3, 1978

[30] Foreign Application Priority Data

May 11, 1977 [GB] United Kingdom ............... 19769/77

[51] Int. Cl.³ ............................................. H01L 21/72
[52] U.S. Cl. .................................... 430/312; 148/1.5; 427/85; 427/93; 430/296; 430/327; 430/330; 430/967; 430/317; 250/492 A; 250/492 B
[58] Field of Search .................... 96/36.2; 250/492 A, 250/492 B; 427/85, 93; 148/1.5; 430/296, 312, 317, 327, 330, 967

[56] References Cited

U.S. PATENT DOCUMENTS

| | | | |
|---|---|---|---|
| 3,542,551 | 11/1970 | Rice | 430/312 |
| 3,679,497 | 7/1972 | Handy et al. | 250/492 R |
| 3,710,101 | 1/1973 | O'Keefe et al. | 250/440 |
| 3,823,015 | 7/1974 | Fassett | 430/312 |
| 4,001,061 | 1/1977 | Ahn et al. | 96/36.2 |
| 4,037,111 | 7/1977 | Coquin et al. | 96/36.2 |
| 4,115,120 | 9/1978 | Dyer et al. | 96/36.2 |

FOREIGN PATENT DOCUMENTS 1193297 6/1967 United Kingdom ...................... 427/82
1443215 7/1976 United Kingdom .

OTHER PUBLICATIONS

O'Keeffe et al., "An Electron Imaging System for the Fabrication of Integrated Circuits," Solid State Electronics, vol. 12, pp. 841–848, (1969).

Scott, "Photo Cathodes for Use in an Electron Image Projector", Journal of Applied Physics, vol. 46, No. 2, Feb. 1975.

Wardly, Rev. Sci. Instrum., vol. 44, No. 10, Oct. 1973.

Primary Examiner—John D. Smith
Attorney, Agent, or Firm—Thomas A. Briody; Robert T. Mayer; Steven R. Biren

[57] ABSTRACT

A method of manufacturing a microminiature solid-state device includes first and second exposure steps in which radiation-sensitive material on a solid-state substrate is exposed radiation through a mask pattern to define locations for localized processing. A local processing step between the first and second exposure steps causes an undesired dimensional distortion of the substrate surface in the plane of the substrate surface. This dimensional distortion is then reduced by adjusting the relative sizes of the area of the substrate surface and the area of the mask used in the second exposure step in an substantially uniform manner prior to the second exposure step. By adjusting the relative sizes of the substrate surface and mask areas in such a way as to compensate for the planar dimensional distortion induced in the first exposure step, such dimensional distortion can be substantially reduced.

22 Claims, 12 Drawing Figures

METHOD OF MANUFACTURING SOLID-STATE DEVICES IN WHICH PLANAR DIMENSIONAL DISTORTION IS REDUCED

THIS INVENTION relates to methods of manufacturing microminiature solid-state devices including first and second steps of exposing radiation-sensitive material at a first major surface of a device substrate to a radiation-pattern from a mask so as to define locations at said surface for localized processing, and at least one processing step as a result of which dimensional distortion of the area of said substrate surface occurs between the first and second exposure steps. The invention further relates to apparatus for use in such methods and to devices, particularly but not exclusively semiconductor devices, manufactured by such methods.

Microminiature solid-state devices are solid-state devices of which the provision of some part or parts needs to be accurate to within microns or fractions of a micron. Examples of microminiature solid-state devices are semiconductor devices (both discrete circuit elements and integrated circuits), surface-wave filters, magnetic-bubble devices, and Josephson-junction devices. Such devices can be manufactured using a radiation-pattern transferred from a mask onto radiation-sensitive material at a major surface of a device substrate to define locations at said surface for localized processing of said substrate. The radiation-pattern may be projected from the mask onto the substrate surface, or the mask and substrate may be in contact. The radiation-pattern may be of, for example, visible or ultra-violet light, X-rays or electrons. The localised processing may include, for example, localized etching of metal, insulating or other layers on the substrate surface, or, for example, localized doping of the substrate.

In the known so-called "planar" process for the manufacture of discrete circuit elements and integrated circuits, photolithographic techniques are generally employed to produce simultaneously a plurality of identical semiconductor devices on a common semiconductor substrate. The process includes several steps of exposing radiation-sensitive material at a first major surface of the substrate to a radiation-pattern from a mask so as to define locations at said surface for localized processing of said substrate. Each radiation-pattern generally comprises an array of identical sub-patterns so that said processing is effected at an array of locations to form an array of identical devices on the substrate. The substrate is divided afterwards into separate bodies for each semiconductor device.

However, in this known process distortion of the substrate surface can occur as a result of processing steps used for forming the semiconductor device structures on the substrate. When such distortion occurs between two exposure steps, the radiation-pattern of the second step, at least over part of its area, may be misaligned with the locations which were defined at the substrate surface in the first exposure step. Such substrate distortion may result from both plastic deformation and elastic strain of the semiconductor crystal lattice.

Elastic strains can result from the stress produced by a change in lattice constant when dopants are introduced into semiconductor materials. They result also from differential thermal expansion effects when insulating or other layers are produced on the semiconductor substrate at elevated temperatures. Sometimes layers themselves may have built-in stresses depending on the way in which they are produced; thus, for example, evaporated metal layers are generally in tension and sputtered layers are frequently in compression. The nature of elastic strain is such that the structure can recover if the stress is removed, for example by removing a deposited layer.

The nature of plastic deformation is such that some structural slippage occurs, so that the structure does not recover when the stress is removed. Plastic deformation can result from factors causing elastic strain if the stress exceeds the elastic limit at a temperature which is sufficiently high that plastic flow can occur; such plastic deformation generally relieves part of the elastic stress and so tends to reduce the dimensional distortion of the substrate which would result otherwise from the excessive stress; the situations where such excessive stress may occur are also generally avoided as they can cause device failures. A more common cause of plastic deformation is thermal strain due to temperature gradients in the substrate during high temperature processing, for example furnace treatments or epitaxy. In the present-day manufacture of solid-state devices care is taken to reduce temperature gradients and other such factors to a level where plastic deformation is generally insignificant.

However, some degree of elastic strain seems unavoidable due to the device requirement of having different materials in the device substrate and at its surfaces. Such strain introduced during the device processing results in dimensional distortion of the area of a major surface of the substrate by either increasing or decreasing the transverse dimensions of said surface. The change in said transverse dimensions may be more than, for example, 0.2 micron, and is often greater. As mentioned hereinbefore, when such distortion occurs between two exposure steps, the radiation-pattern used in the second step may be misaligned. This is particularly significant when an array of devices are being formed on a common substrate having large major surfaces. Thus, for example, although at one area of the substrate surface a sub-pattern of said radiation-pattern may be aligned with locations which were defined in the first exposure step, sub-patterns at areas remote from said one area will generally be misaligned with the corresponding locations; this can lead to a large number of the manufactured devices having undesirable characteristics or even being unusable; this is particularly acute with the present trend towards even more compact patterns and even smaller dimensions for many of these microminiature devices.

This problem of dimensional distortion causing pattern misalignment can thus limit the resolution usable in, for example, image projection systems where the whole of a large substrate surface is exposed at the same time to, for example, an electron-beam, X-ray or ultra-violet radiation pattern. However, an advantage of such whole-surface projection systems is that a large array of microminiature solid-state devices can be fabricated simultaneously on the substrate in a time which is considerably shorter than that required using separate steps to expose each device area or part. Therefore, such systems are generally more attractive for manufacturing purposes, provided the said misalignment problem can be alleviated.

It is an object of the present invention to provide methods and apparatus for the manufacture of microminiature solid-state devices in which the misalignment effect of such dimensional distortion is reduced. The invention is based on the recognition that such a reduction can be achieved comparatively simply in the manufacture of such devices by adjusting substantially uniformly the relative sizes of the area of the distorted substrate surface and the area of the mask this can be achieved because most of the elastic strains which occur are generally isotropic in the plane of the substrate, resulting in substantially uniform expansion or contraction of the size of the substrate surface.

Thus according to one aspect of the present invention, there is provided a method of manufacturing a microminiature solid-state device including first and second steps of exposing radiation-sensitive material at a first major surface of a device substrate to a radiation-pattern from a mask so as to define locations at said surface for localized processing, and at least one processing step as a result of which dimensional distortion of the area of said substrate surface occurs between the first and second exposure steps, in which method, for the second exposure step, the relative sizes of the area of said substrate surface and the area of the mask used are adjusted substantially uniformly so as to reduce the effect of said dimensional distortion on the relative locations defined by said first and second exposure steps.

Such a method can thus be particularly advantageous with large substrate surfaces, in systems where the radiation patterns are projected or otherwise transferred onto the whole of the substrate surface with small pattern detail and a high resolution. Such a system may use, for example X-ray, electron-beam or ultra-violet image projection. Such a method is particularly advantageous where the dimensional distortion between exposure steps is sufficient to cause the largest transverse dimension of said substrate surface to increase or decrease by more than, for example, 0.1 micron. Such a method can give some improvement in alignment even when some plastic deformation is present in addition to elastic strain.

At least part of the dimensional distortion may be caused by elastic strain produced in the underlying part of said substrate by a layer provided adjacent at least one major surface of the substrate; such a situation is common in the manufacture of microminiature solid-state devices; such a layer may be for example a metal or other conducting layer or insulating layer provided on the substrate; it may be a doped layer provided in the substrate, for example at least when the substrate comprises semiconductor material for the manufacture of a semiconductor device. The layer producing the elastic strain may often be provided adjacent substantially the whole of at least one major surface of the substrate.

In order to reduce the effect of said dimensional distortion, the size of the area of the mask pattern to be projected can be adjusted by making the mask to be used at a slightly increased or decreased magnification. However, this can complicate mask fabrication.

In a preferred form of the method, the relative sizes of the mask and substrate are adjusted by maintaining either one or both of the mask and substrate at a different temperature during different exposure steps. In this preferred form, use is made of the thermal expansion coefficient of the material of the mask and/or of the substrate, and the substantially isotropic nature of thermal expansion or contraction. It has been found that in many cases a temperature difference of only a few degrees centigrade is necessary. The mask or substrate temperature may be adjusted manually having previously calculated the temperature difference necessary to compensate for the dimensional distortion. However, an advantage of the thermal compensation technique is that the temperature adjustment may be effected automatically by deriving and using a signal indicative of said dimensional distortion.

According to another aspect of the present invention, there is provided apparatus for exposing a device substrate to radiation-patterns in a method in accordance with the first aspect of the invention, comprising substrate-mounting means for mounting the device substrate, mask-mounting means for mounting the mask in front of the substrate, radiation means for exposing the substrate surface to a radiation-pattern through the mask, and further means for adjusting the temperature of either one or both of the mask and substrate so as to permit either one or both to be maintained at a different temperature during different exposure steps. During exposure, the mask and substrate may be held in contact with each other, or the apparatus may be of the projection type.

Thus, according to a further aspect of the present invention, there is provided apparatus for the projection of radiation-patterns in a method in accordance with the first aspect of the invention. Such apparatus may comprise a thermally-conductive mount for mounting the device substrate, mask-mounting means for mounting the mask in front of the substrate, and heating means associated with the substrate mount so as to permit the substrate to be maintained at a different temperature during different projection steps.

Such apparatus permits the relative sizes of the mask and substrate to be adjusted using the hereinbefore described preferred form of the method.

In order to permit automatic adjustment of said relative sizes, detector means may be associated with said substrate mount to develop a signal indicative of said dimensional distortion, and the heating means associated with the substrate mount may be regulated by control means which have an input for said signal and permit the temperature of said substrate mount to be brought to a value determined by said signal.

Embodiments of various aspects of the present invention will now be described, by way of example, with reference to the accompanying drawings, in which.

Although for the sake of convenience embodiments of the invention will now be described in terms of semiconductor device manufacture, it should be understood that the present invention is also applicable to other microminiature solid-state devices, for example magnetic-bubble devices, surface-wave filters and Josephson-junction devices. In this case different device substrates and materials will generally be necessary.

It should also be understood that FIGS. 3 to 12 are not drawn to scale and that the relative dimensions and proportions of various parts of these Figures have been shown exaggerated or reduced for the sake of clarity.

Figure 1:
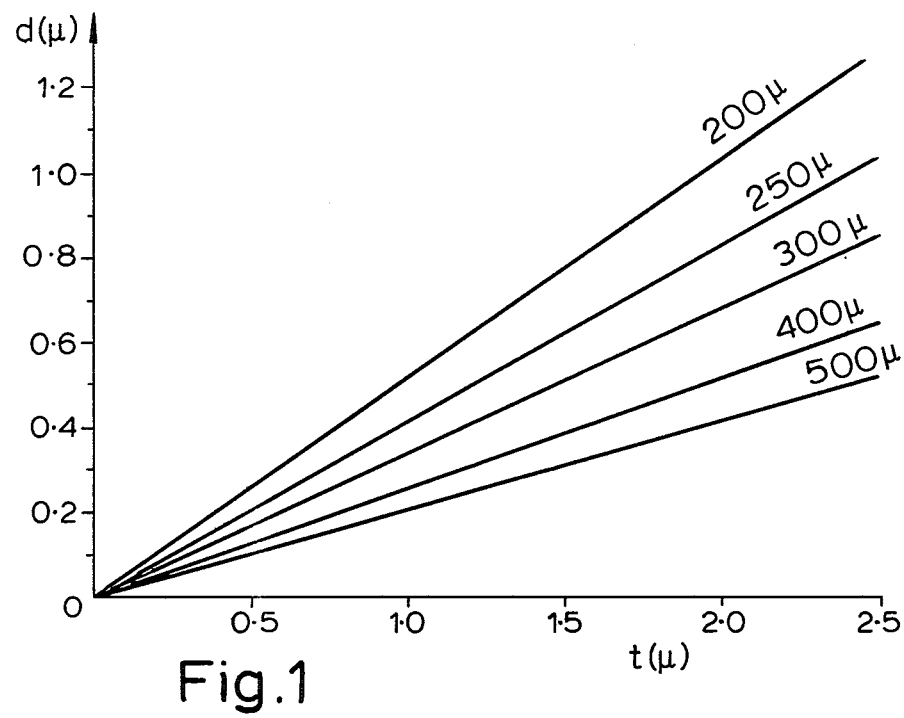
FIG. 1 is a graph illustrating the change d in diameter of silicon wafers of different thickness as a result of growing thereon thermal oxide having a total thickness t.

Silicon oxide layers grown on silicon wafers by thermal oxidation of the silicon have a small thermal expansion coefficient than the underlying silicon. The process is such that the oxide layer is generally formed over the whole wafer including both of its opposite major surfaces. When the oxidized wafer cools to room temperature the oxide layers at both of its major surfaces cause the transverse dimensions of these major surfaces to expand; in this case the plane of the wafer remains substantially flat but its transverse dimensions expand. The graph of FIG. 1 provides examples of the relationship between the change d in the 75 m.m. diameter of a circular silicon wafer, the thickness of the wafer, and the total thickness t of such thermally grown oxide. The different lines are for different wafer thicknesses from 200 to 500 microns. The values of the change d illustrated in FIG. 1 are calculated values, and both d and t are in microns. From FIG. 1, it can be seen that growing a 0.5 micron thick thermal oxide layer on both major surfaces of a 300 microns thick silicon wafer having a diameter of 75 m.m. can cause the diameter of the wafer to expand by between 0.3 and 0.4 micron. The dimensional distortion is substantially uniform across the diameter of the wafer.

If the oxide layer is removed from one of the opposite major surfaces but maintained over all or most of the area of the other major surface, the plane of the wafer bows so that one major surface becomes convex while the other is concave. This bow can be measured and is directly related to the degree of expansion of one major surface of the wafer as compared with the opposite major surface. It is normal practice to flatten the plane of such a bowed wafer when performing a lithographic exposure step. The expansion of the diameter of the flattened wafer is approximately half of that which occurs when such an oxide layer is present on both major surfaces of the wafer.

In general, this dimensional distortion which occurs at a major surface of such a wafer due to an oxide layer on one or both of its opposite major surfaces is directly proportional to the diameter of the wafer and inversely proportional to the thickness of the wafer. Thus, the dimensional distortion will be worse the larger the diameter of the wafer and the smaller its thickness.

Figure 2:
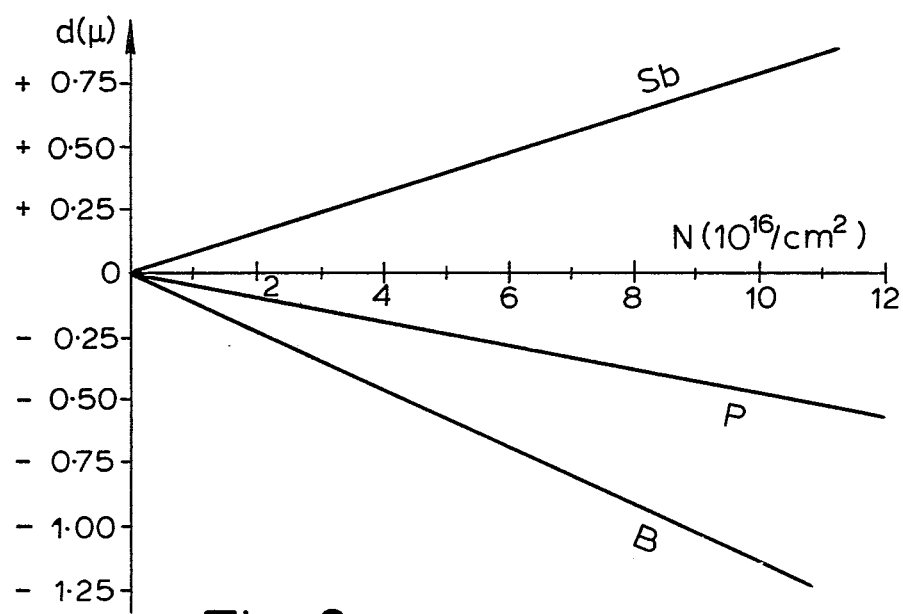
FIG. 2 is a graph illustrating the change d in diameter of a silicon wafer as a result of incorporating therein different dopants in a dose of N dopant atoms per unit area.

The graph of FIG. 2 provides examples of the relationship between the change d (in microns) in diameter of a circular silicon wafer and the total amount N (in dopant atoms per sq. cm.) of a dopant incorporated in the wafer. The dopant is assumed to be present over at least one major surface of the wafer either in a continuous layer or in an array of sub-patterns which repeat at distances which are small (for example, by an order of magnitude) compared with the diameter of the wafer. The values of N are the total amount of the dopant in the wafer divided by the total area of a major surface of the wafer. The lines Sb, P and B are examples of lines for antimony, phosphorus and boron respectively. The wafer of FIG. 2 has a diameter of 75 m.m. and a thickness of 300 microns. As can be seen from FIG. 2, the effect of a dopant dose of, for example, $4 \times 10^{16}$ dopant atoms/cm$^2$ can be an increase of approximately 0.3 micron in the diameter using antimony as the dopant, a decrease of approximately 0.2 micron using phosphorus and a decrease of between 0.4 and 0.5 microns using boron. The dimensional distortion is again substantially uniform across the diameter of the wafer and is again directly proportional to the diameter and inversely proportional to the thickness of the wafer. If the whole of both major surfaces is similarly doped, the plane of the wafer remains flat, but if only one major surface is so doped the plane of the wafer is once again bowed until flattened for lithographic exposure.

Figures 3, 4:
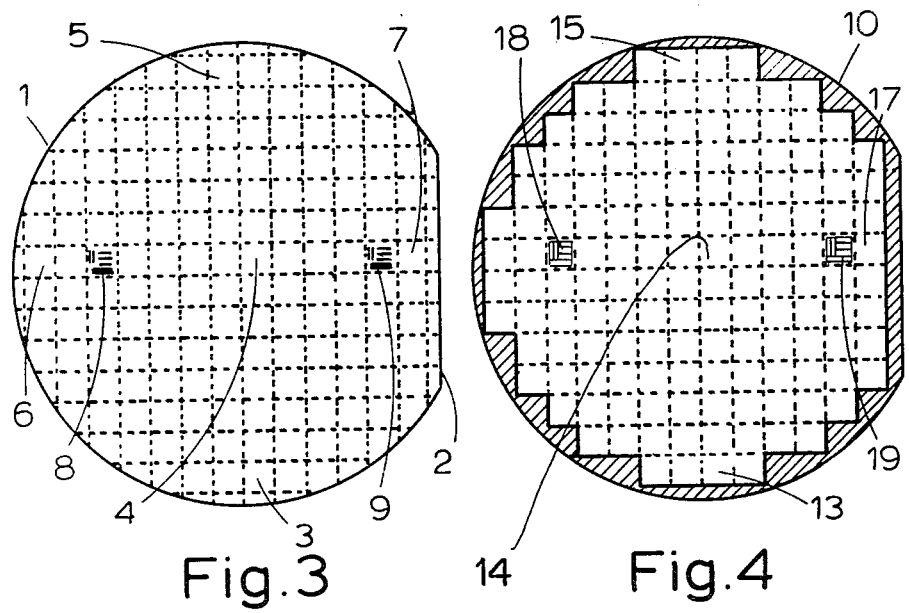
FIG. 3 is a diagrammatic plan view of a major surface of a silicon wafer for the manufacture of a plurality of semiconductor devices.
FIG. 4 is a diagrammatic plan view of a mask the pattern of which is to be projected onto the major surface of the wafer of FIG. 3.

Such dimensional distortions resulting from thermal oxide growth and doping of semiconductor wafers can have a serious effect on semiconductor manufacture. FIG. 3 shows a silicon wafer 1 on which an array of semiconductor devices can be fabricated. Each device may be, for example, an integrated circuit comprising insulated-gate field-effect transistors, and, as an example, the manufacture of such devices will be considered hereinafter with reference to FIGS. 5 to 10. The wafer of FIG. 3 may have a diameter of, for example 75 m.m. A flat 2 may be provided on its circular edge for crude positioning of the wafer in processing equipment.

In FIG. 3, each area of the wafer 1 where an individual integrated circuit is to be fabricated is indicated in FIG. 3 as a rectangular area (for example areas 3 to 7) bounded at its four sides by dotted lines. These dividing lines are in two orthogonal sets, one set of which may be parallel to the flat 2 as shown in FIG. 3. The semiconductor wafer 1 is subsequently divided along these lines to provide the individual bodies of each integrated circuit. In general it is desired to fabricate an identical integrated circuit at each of the rectangular areas. The other areas which are bounded in part by the edge of the wafer do not form useful device areas. At least two of the rectangular areas may however be occupied by markers 8 and 9 which, as will be described hereinafter, may be used for mask alignment; in this case, no integrated circuit is fabricated at these two areas.

Several steps in the manufacture of the integrated circuits involve transferring a radiation-pattern from a mask onto radiation-sensitive material at a major surface of the device substrate formed by the silicon wafer 1. This may be effected using a projection technique. The projection steps selectively expose the radiation-sensitive material so as to define locations at said surface for localized processing for the fabrication of the semiconductor devices. FIG. 4 illustrates a mask 10 used for one of these projection steps. The mask itself consists of a mask pattern which is generally of metal formed on a substrate which may be of quartz. The mask pattern which is to be projected consists of a plurality of identical sub-patterns (for example sub-patterns 13 to 17) in an array corresponding to the desired device array for the wafer 1. Individual features of each sub-pattern are measured in microns and so are not shown in FIG. 4.

Each mask is concerned with defining the locations over the whole device substrate surface for a single processing step, for example local removal of an oxide or metal layer. The different masks used for different processing steps generally have the same overall dimensions for the array of sub-patterns, but the sub-patterns of each mask usually have different individual features for each processing step. When dimensional distortion of the area of the surface of the device substrate occurs between two projection steps using two such masks, then, unless some compensation is effected, the radiation-pattern projected in the second step would become misaligned with the locations which were defined at the substrate surface in the first projection step. Thus, for example, between the two projection steps the surface of the device substrate may have contracted, and the mask 10 of FIG. 4 may be that used in the second projection step. If the sub-pattern 17 of mask 10 was substantially aligned on the device area 7 of the contracted wafer 1 without compensation, the sub-patterns 13, 14, 15 and 16 would not be aligned with their respective device areas 3, 4, 5 and 6 but would be displaced somewhat towards the circular edge of the wafer 1. This can result in undesirable device characteristics and even faulty devices.

However, in accordance with the present invention, for the second projection step the relative sizes of the area of the device-substrate surface and the area of the mask 10 are adjusted substantially uniformly so as to reduce the effect of said dimensional distortion on the relative locations defined by the first and second projection steps. This can be effected in a simple manner by using, for example, thermal expansion of the substrate to at least partially compensate for the dimensional contraction introduced by the processing. For this purpose the projection apparatus of FIG. 11 or FIG. 12 may, for example, be used.

The use of a distortion-compensating technique in a known type of device-manufacturing process will now be described, by way of example, with reference to FIGS. 5 to 10.

Figure 5:
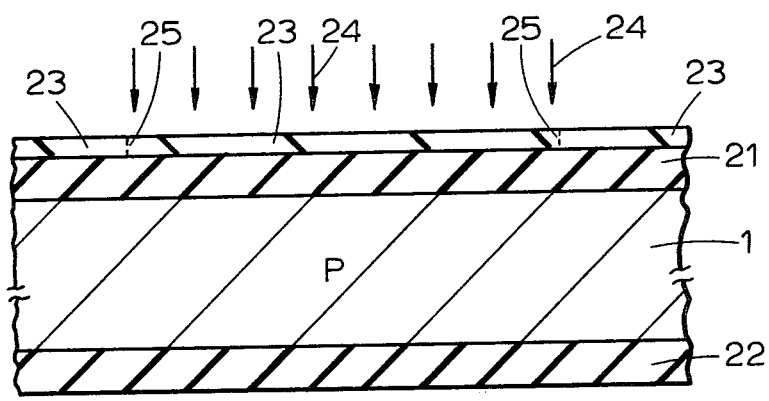
FIGS. 5 to 10 are diagrammatic cross-sectional views of part of a silicon wafer at successive steps in the manufacture of a semiconductor device.

FIG. 5 shows part of a device substrate comprising part of a p-type monocrystalline silicon wafer 1 having insulating layers 21 and 22 of silicon oxide at both of its opposite major surfaces. As an example, steps in the manufacture of an n-type channel enhancement-mode insulated-gate field-effect transistor will be described. In general one transistor will be only one of many circuit-elements of an integrated circuit, so that the device substrate portion illustrated in FIG. 5 will form only a fraction of a device area (for example area 6) of a wafer 1 such as that shown in FIG. 1. It should therefore be understood that processing effected at the substrate portion shown in FIGS. 5 to 10 is also effected in general at other locations in the device area 6 and at the other device areas (for example areas 3, 4, 5 and 7).

The silicon oxide layers 21 and 22 were produced on the wafer 1 by thermal oxidation of the silicon surface so as to have a thickness of, for example, 1 micron each. This may be achieved by for example heating the wafer 1 in water vapor for about 100 minutes at 1150° C. As can be seen from FIG. 1, this oxidation causes the 75 m.m. diameter of a 300 microns thick wafer 1 to increase by approximately 0.7 micron.

The layer 21 at one major face of the device substrate is then coated in known manner with radiation-sensitive material to form a resist layer 23. A radiation-pattern 24 is then projected from a mask onto the resist layer 23 on the device substrate.

The radiation used in the projection steps of this manufacturing process may be for example, violet or ultra-violet light, electrons or X-rays, and the resist layer is of a correspondingly sensitive material. During the projection steps the substrate may be mounted on a thermally-conductive mount such as the mount 50 of FIG. 11 and FIG. 12.

Figure 6:
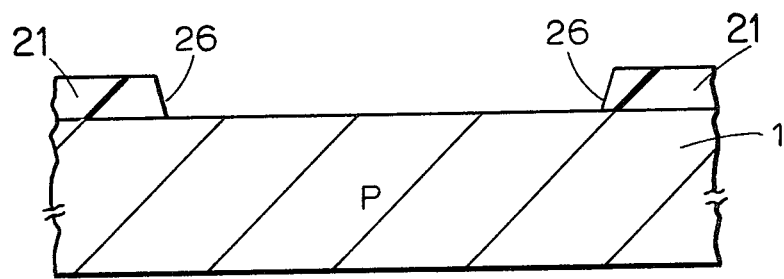
Figure 7:
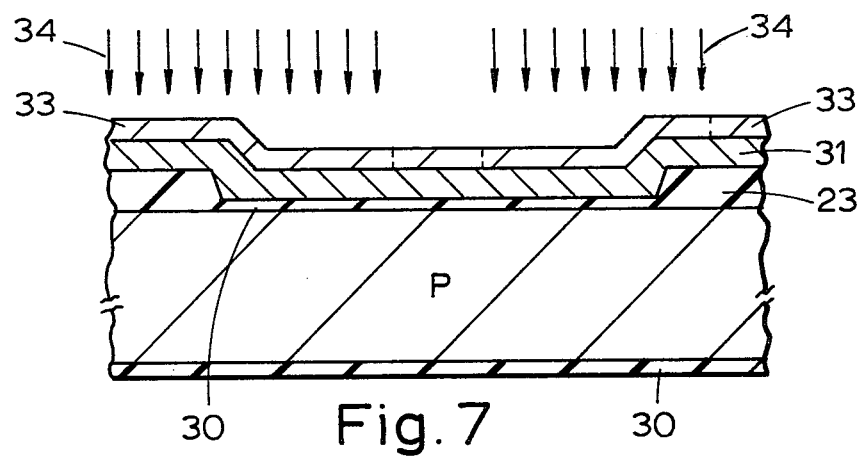

The radiation-pattern 24 projected in the first projection-step has sub-patterns which selectively expose the resist layer 23 to define locations where the oxide layer 21 is to be locally removed for the formation of field-effect transistors. The edges of one such area are designated by reference 25 in FIG. 5. The resist where exposed to the radiation 24 at areas 25 is then developed and removed in known manner so that the remainder of the resist layer 23 forms a mask pattern on the oxide layer 21. The device substrate is then subjected in known manner to an etching treatment to open windows 26 in the oxide layer 21 at the areas 25 while the remainder of layer 21 is protected against the etchant by the resist pattern. The oxide layer 21 remains on typically at least 70 or 80 percent of the front surface of the device substrate. The sub-patterns of windows 26 are substantially uniformly distributed as an array over said surface. However, the etching treatment also removes the oxide layer 22 at the unprotected back face of the device substrate. Such a situation is common in semiconductor device manufacture. The resulting structure is shown in FIG. 6. Thus, as previously described with reference to FIG. 1 the etching step reduces the expansion of the device substrate so that the diameter of the device substrate of FIG. 6 when flattened will have contracted by at least 0.35 micron compared with its size during the projection step of FIG. 5. This dimensional distortion is substantially linear and uniform over the front surface of the device substrate.

More oxide is now grown in known manner on the device substrate, again by thermal oxidation to form an oxide layer 30 which may have a thickness of for example 400 to 1,000 Å (0.04 to 0.10 micron). It grows not only at the windows 26 in the thick oxide layer 23 but also at the exposed back face of the wafer 1. This small thickness of oxide only very slightly expands the diameter of the wafer 1.

Polycrystalline silicon is then deposited in known manner on the oxide layer 23 and 30 at the front face of the wafer 1 to form a layer 31 having a thickness of, for example, 0.5 to 0.8 micron. No polycrystalline silicon is deposited on the layer 30 on the back face. The deposited silicon layer has no significant effect on the dimensional distortion of the wafer 1.

The polycrystalline silicon layer 31 is subsequently coated in known manner with a resist layer 33 and subjected to a second projection step. The radiation pattern projected from the mask (such as mask 10 of FIG. 4) has sub-patterns 34 which selectively expose the resist layer 33 to define locations where the polycrystalline silicon is to be removed to leave silicon gates for the transistors and silicon conductive tracks. During this projection step the bowed device substrate may be flattened against the mount 50 using the technique to be described hereinafter with reference to FIGS. 11 and 12. Either one or both of the mask 10 and the device substrate 1, 30, 23, 31 is maintained at a different temperature during this projection step compared with the corresponding temperatures during the projection step of FIG. 5; in this simple manner the relative sizes of the mask and substrate are adjusted by the thermal expansion or contraction to reduce the effect of the dimensional distortion of the device substrate which occurred after the first projection step illustrated in FIG. 5. This can be effected by heating the device substrate 1, 30, 23, 31. The temperature difference T required to effect a linear dimensional change d in the diameter D of a silicon wafer 1 is given by the formula:

$$T = (d/\alpha \cdot D)$$

where $\alpha$ is the coefficient of thermal expansion of silicon. Taking a value of $3.8 \times 10^{31\ 6}$ per °C. for $\alpha$, a 75 m.m. diameter wafer requires an increase in its temperature of approximately $1\frac{1}{4}$° C. to compensate for a contraction of approximately 0.35 micron.

By thus regulating the temperature of the device substrate, an improvement is obtained for all the device areas 4 to 7 in aligning the locations defined by the radiation pattern 34 with the edges of the windows 26 defined by the radiation pattern 24 in the projection step of FIG. 5.

Figure 8:
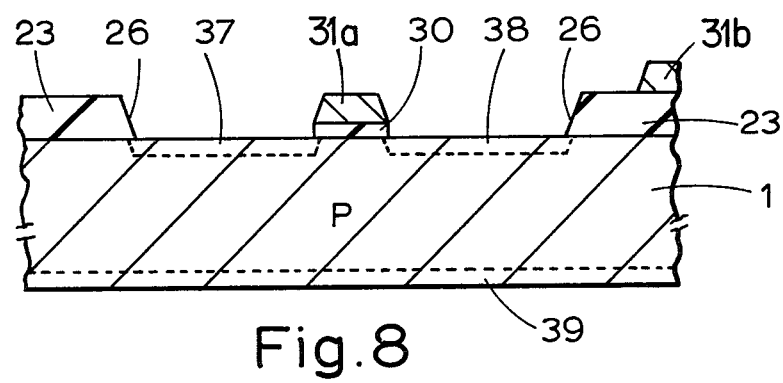

The exposed resist is then developed and removed and the remaining resist layer 33 is used as an etchant mask for the polycrystalline silicon layer 31. FIG. 8 shows, by way of example, two remaining parts 31a and 31b of the layer 31; part 31a is present on the thin oxide layer within the window 26 to provide a gate of a transistor; part 31b is present on the thick oxide layer 23 to form, for example a connection track.

After forming the gates and conductive tracks from the silicon layer 33 the device substrate is subjected to a further etching treatment to remove the exposed areas of the thin oxide layer 30. The silicon-layer parts protect the underlying oxide against the etchant. The resulting structure is shown in FIG. 8.

The device substrate may now be subjected to a phosphorus diffusion to form the source and drain zones of the transistors and to dope the silicon-layer gates and conductive-tracks. This may be effected in known manner by heating the structure of FIG. 8 at 900° C. for half an hour in a gas stream of nitrogen with 2.5% oxygen, the oxygen having been bubbled through liquid $POCl_3$ at 26° C. so as to be saturated with $POCl_3$ vapor. The phosphorus diffuses into areas 37, 38 and 39 of the silicon wafer via the exposed silicon surface parts at the front face and via the whole of the exposed back face. These areas 37, 38 and 39 are shown in dotted outline in FIG. 8 and as n-type zones in FIG. 9; the localized n-type zones 37 and 38 form the transistor source and drain zones; the zone 39 extends across the whole back face of the wafer 1 and may be removed at a later stage. This phosphorus diffusion process results in an area concentration N of approximately $2 \times 10^{16}$ phosphorus atoms per sq. cm., mostly as a result of area 39. As a result of this doping, a further contraction of approximately 0.1 micron occurs in the diameter of the device substrate when the plane of the substrate is flattened. Once again, the dimensional distortion is substantially uniform and linear over the front surface of the device substrate.

Silicon oxide is then deposited in known manner over only the front face of the device substrate to form a layer 40 having a thickness of, for example, 0.5 to 0.8 micron. The deposition may be effected by, for example, low-temperature oxidation of silane, and the layer so formed may subsequently be heated in the usual manner to improve its properties. Such a layer 40 may increase the diameter of the contracted device substrate by, for example, 0.15 micron.

Figure 9:
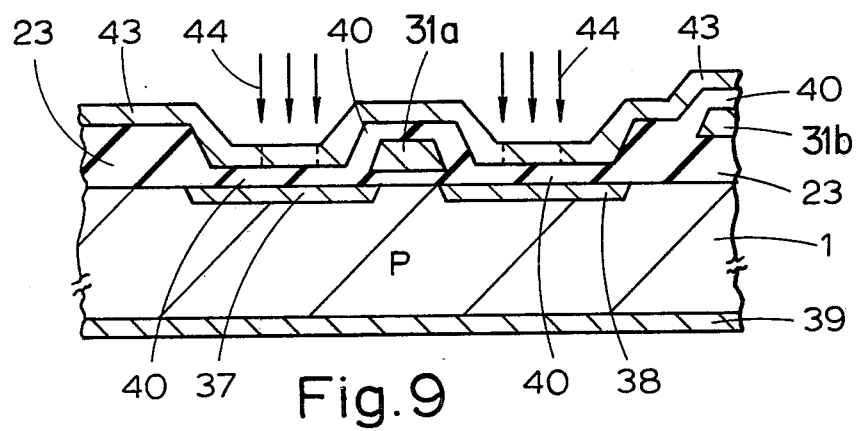

A resist layer 43 is subsequently provided on the front face of the resulting device substrate, and a radiation pattern 44 from a third mask is projected onto the layer 43 to define locations at which contact windows are to be etched in the oxide layer 40; these contact windows permit contacting of source and drain zones 37 and 38 and polycrystalline silicon gates 31a and tracks 31b. During this projection step which is illustrated in FIG. 9, the temperature of the device substrate may now be increased by between $1\frac{1}{4}$° and $1\frac{1}{2}$° C. compared with its temperature in the projection step of FIG. 5. This temperature change reduces the effect of the approximately 0.3 micron contraction which has occurred in the substrate diameter since the projection step of FIG. 5. The mask temperature is maintained substantially the same as in both the previous projection steps of FIGS. 5 and 7, and preferably the mask substrate in each case is made of material having a low thermal expansion coefficient, for example quartz, so as to minimize dimensional changes in the mask.

Figure 10:
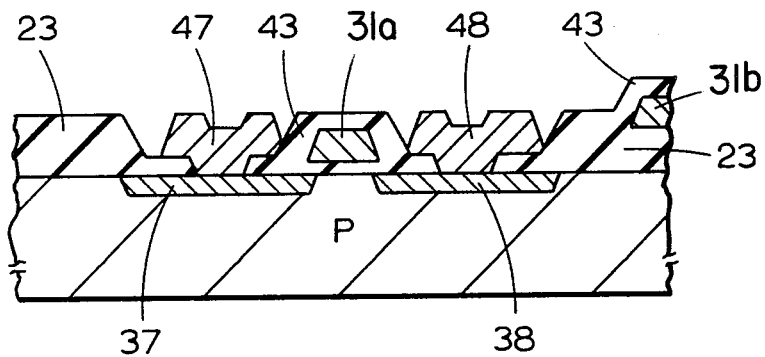

After forming the contact windows in the oxide layer 40, aluminium is deposited to form a metal layer which is then coated with a further resist layer. A further lithographic and etching stage is then effected to define a metal contact layer pattern, two parts of which are illustrated in FIG. 10. During the projection step in this further lithographic stage, the substrate is maintained at substantially the same temperature as in the projection step of FIG. 9, because the aluminium layer is found to have little effect on the dimensional distortion. The silicon wafer 1 may subsequently be thinned from its back surface and the n-type zone 39 may thus be removed before metallizing the back surface. Subsequently the wafer 1 is divided in known manner into separate device bodies for each integrated circuit. Part of one such body is shown in FIG. 10.

Figure 11:
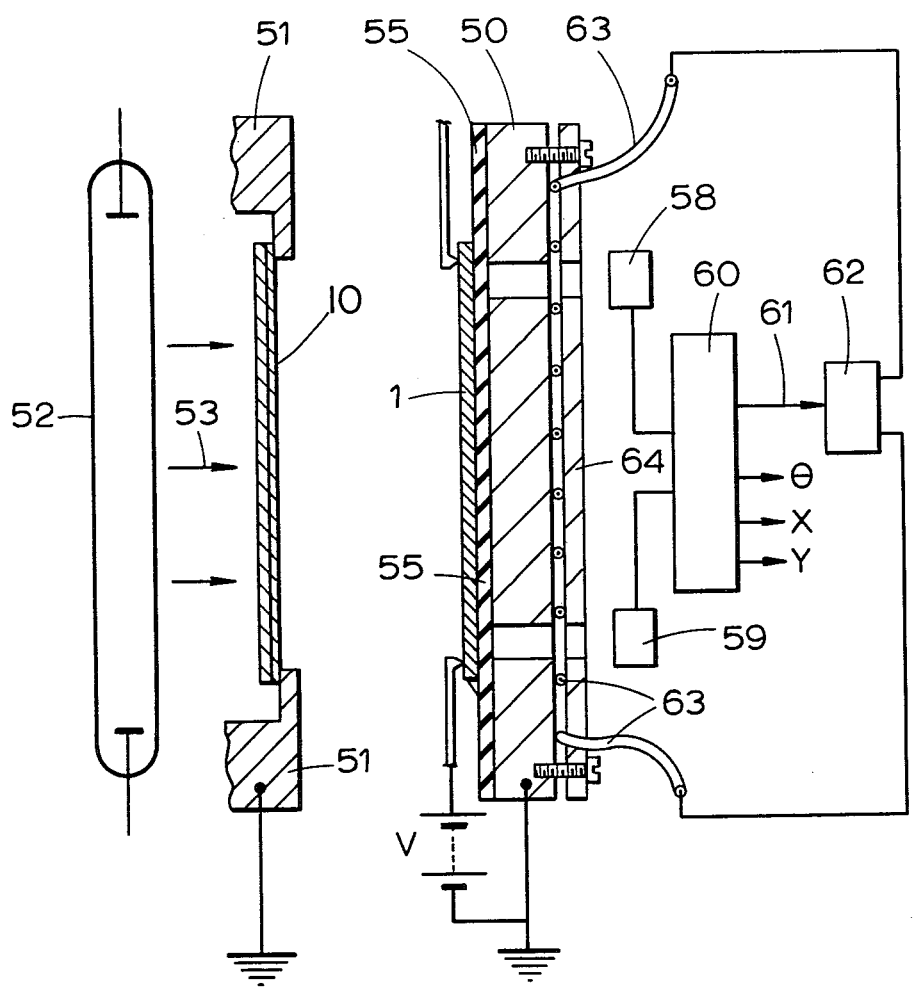
FIGS. 11 and 12 are diagrammatic representations, partly in cross-sectional view, of different forms of image-projection apparatus for exposing a device substrate to a radiation-pattern from a mask.
Figure 12:
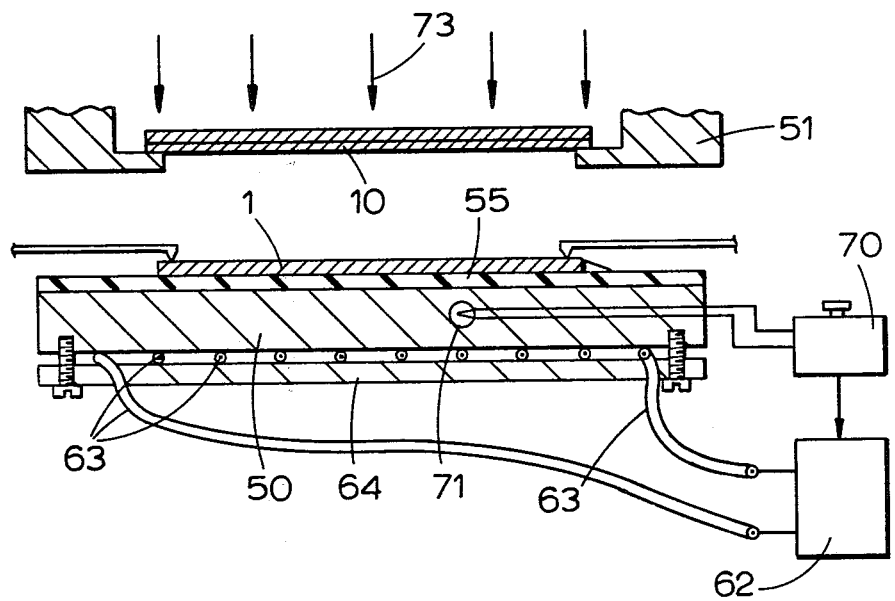

This method may, for example, use the projection equipment illustrated in FIG. 11 or FIG. 12. FIG. 12 shows part of an electron-beam image projection system. Projection systems and techniques using electron-beam image projection are already known and are described in for example U.S. Pat. Nos. 3,679,497 and 3,710,101, the article by T. W. O'Keefe, J. Vine and R. M. Handy in "Solid State Electronics," Vol. 12 (1969), pages 841 to 848, and the articles by J. P. Scott in "Journal of Applied Physics," Vol. 46, No. 2 (February 1975), pages 661 to 664 and "Proceedings of Sixth International Conference on Electron and Ion Beam Science and Technology" (Electrochemical Society, Princeton, N.J.), pages 123 to 136. The whole contents of these published Patent Specifications and articles are hereby incorporated by reference into the present Specification.

The equipment of FIG. 11 comprises an electrically and thermally conductive mount 50 for mounting the device substrate 1, and an electrically and thermally conductive mask-mounting means 51 for mounting the mask 10 in front of the device substrate 1. The mask 10 includes, in known manner, a photoemissive layer over the whole of its major surface facing the device substrate 1. Its opposite major surface is illuminated by an ultra-violet lamp 52, the ultra-violet light 53 from which causes the photoemissive mask 10 to emit electrons in a pattern determined by the pattern of the mask. A vacuum is present between the mounts 50 and 51 and a high positive potential V is applied between the mask-mount 51 and the substrate 1 to accelerate the electron beam from the mask 10 towards the substrate 1. The patterned electron beam is focussed onto the substrate 1 by a magnetic field which is generated by electro-magnets not shown in FIG. 11 for the sake of clarity.

During projection of the electron image from the mask 10, the plane of the substrate 1 is held substantially flat in a simple advantageous manner using electrostatic force to clamp the substrate against a dielectric layer 55 on the surface of the mount 50. The electrostatic force results from applying the potential V also across the layer 55, between the substrate 1 and the mount 50. Similar electrostatic clamping techniques have been previously described in for example British Pat. No. 1,443,215 and the article by G. A. Wardly in Rev. Scientific Instruments, Vol. 44, No. 10, pages 1506 to 1509. The whole contents of this British Patent Specification and article are hereby incorporated by reference into the present Specification.

As mentioned hereinbefore with reference to FIG. 3, the device substrate may comprise two spaced-apart alignment-markers 8 and 9. These markers may be for example of the type described in said articles by J. P. Scott and in British patent application No. 40776/75. The photocathode mask 10 may include two correspondingly-located alignment sub-patterns the pattern of which is complementary to that of the markers 8 and 9 so that these mask areas emit an electron pattern corresponding to the pattern of the markers 8 and 9. Brehmsstrahlung X-ray emission from the markers 8 and 9 can then be used in known manner to indicate alignment of the markers 8 and 9 with the mask areas 18 and 19. X-ray detectors 58 and 59 associated with the mount 50 can detect the X-ray signal through apertures in the mount 50 and generate electrical signals which can be processed in known manner by circuitry 60 to provide electrical signals X, Y, $\theta$ and 61. U.S. Pat. No. 3,710,101 describes one suitable type of circuitry 60 for deriving such output signals. The X and Y signals represent the error in the alignment of one marker (e.g. marker 8) in two perpendicular directions. The $\theta$ signal represents the error in the alignment of the other marker 9 as an angular rotation about marker 8. The signals X, Y and $\theta$ are fed to the electromagnets to correct the misalignment in known manner. The signal 61 corresponds to the size error signal of U.S. Pat. No. 3,710,101 which is the error in the size or magnification of the projected electron beam as measured at the surface of the device substrate. This signal 61 is also indicative of the dimensional distortion of the area of the substrate surface when such distortion arises from the device processing. Thus signal 61 can be used to regulate a heater supply for a heating element 63 associated with the substrate-mount 50; in this way the temperature of mount 50 can be brought to value determined by the signal 61 so that the equipment can adjust automatically the temperature of the substrate 1 so as to reduce the effect of the dimensional distortion of the substrate 1.

The heating element 63 may be, for example, a meandering resistance element in an insulating sheath which is sandwiched between the bulk of mount 50 and a backing plate 64 bolted or otherwise attached thereto. If so desired cooling means may also be associated with mount 50 so that when not heated the mount 50 is maintained at a temperature below that of the mount 51. Such cooling means may comprise ducts in the mount 50 to permit flow of a liquid coolant therethrough. If so desired, instead of using a heating element 63 and heater supply 62, a liquid flowing through ducts in the mount 50 may provide the desired heating or cooling effect for the mount 50 by regulating the temperature of such a liquid in accordance with signal 61. The projection equipment is operated in a temperature-controlled environment to minimize external temperature effects on the mask and device dimensions during projection steps. Preferably all the masks used have a quartz substrate which has a very low thermal expansion coefficient so that any slight change in the mask temperature for different projection steps or even during the same step will not significantly affect the dimensions of the mask pattern. The thermal capacitance of the mount 50 should be sufficiently large to render insignificant any heating of the device substrate by the incident electron beam itself.

FIG. 12 shows part of a modified form of equipment of which parts similar to those of FIG. 11 are generally given the same reference numerals. In the arrangement of FIG. 12, a signal indicative of the dimensional distortion is not used to automatically adjust the temperature of the mount 50; instead, the heater supply 22 for the element 63 is regulated by manually-adjustable control means 70. The setting of the control means 70 can be adjusted to determine the temperature of the mount in accordance with a known amount of dimensional distortion and a previous calculation for the temperature necessary to reduce the distortion. A thermocouple 71 embedded in the mount 50 can also be used to supply a feed-back signal to the control means 70 to ensure that the temperature of the mount 50 is maintained at the temperature determined by the manual setting of the control means 70.

The equipment of FIG. 12 may also be of the electron-beam image projection type. However it may instead be of the X-ray or ultra-violet image projection type: in this case, the mask 10 no longer comprises a photoemissive layer but has different areas which are opaque and transparent to the X-ray or ultra-violet radiation 73 so that an X-ray or ultra-violet pattern is transferred to the device substrate 1. The substrate 1 may be flattened against the mount 50 by electrostatic clamping; however, if desired, a conventional type of vacuum chuck may be used instead of this electrostatic chuck in, for example, an ultra-violet radiation exposure system, because in this case no vacuum is necessary between the mounts 50 and 61 so that, for example, atmospheric pressure may be used to clamp the substrate 1 against the vacuum chuck.

It will be obvious that many other modifications are possible within the scope of the present invention. Thus, for example in the system of FIG. 11, the effect of said dimensional distortion may be reduced by using the signal 61 partly to adjust the magnification of the projected radiation pattern and partly to adjust the temperature of substrate-mount 50. In a system in which the mask substrate has a significant thermal expansion coefficient the effect of the dimensional distortion of the device substrate 1 may be reduced by adjusting the temperature of the mask 10 instead of, or in addition to, adjusting that of the substrate 1.

In the method of manufacture described with reference to FIGS. 5 to 10, a p-type diffusion or implantation may be effected in known manner locally into the front surface of the wafer 1 before growing the oxide layer 21 so as to inhibit the formation of inversion channels under the oxide 21 in the final device. In this case, it is desirable to align the projection step of FIG. 5 (for defining the windows 26) relative to this locally provided p-type zone. Between the projection step used to define the locally provided p-type zone and the projection step shown in FIG. 5, the diameter of the wafer 1 will have expanded due to the thick oxide growth. Thus, in order to reduce the effect of dimensional distortion between these two projection steps, the wafer 1 may be heated to a higher temperature during the first of these projection steps, than for subsequent steps.

It can be seen from FIG. 2, that the introduction of $10^{16}$ boron atoms per sq. cm. into a silicon wafer can cause more dimensional distortion of the size of the wafer than does $2 \times 10^{16}$ phosphorus atoms per sq. cm., so that some compensation of the dimensional distortion may often be desirable even for this lower dose of boron. The previously mentioned British Patent Application 40776/75 describes and shows by way of example the manufacture of an integrated circuit comprising bipolar transistors for which an image-projection system is used. It will be obvious that the present invention can be used with advantage in the manufacture of bipolar transistor circuits; in this connection more than $2 \times 10^{16}$ boron atoms per sq. cm. may be introduced into the silicon wafer as a result of a boron diffusion to form p-type isolation walls for electrical isolation of circuit elements in the integrated circuit. Also a phosphorus diffusion which may be used to provide the emitter zone of the bipolar transistor may introduce into the device substrate more than $2 \times 10^{16}$ phosphorus atoms per sq. cm. The use of the present invention to reduce the resulting dimensional contraction in the size of the semiconductor device substrate is therefore advantageous for exposure steps effected after these boron and phosphorus diffusions. In both these cases most of the doping and dimensional contraction results from diffusion into the whole of the exposed back surface of the device substrate. Such a situation in which localized processing at the front surface of a device-substrate affects the whole of the back surface can often occur in the manufacture of microminiature solid-state devices and can often cause dimensional distortion of the area of the substrate surface between two exposure steps.

Instead of using a projection system in which the radiation-sensitive material on the device substrate 1 is exposed through a mask 10 spaced from the device substrate 1, a system may be used in which the device substrate and mask are in contact during the exposure. In this case, the device substrate has the same temperature as the mask, but the differential thermal expansion of the mask and substrate can be used to compensate for said dimensional distortion of the device substrate by having a different temperature for the mask and device-substrate assembly in different exposure steps.

What we claim is:

1. A method of manufacturing a microminiature solid-state device, which comprises:
   providing a radiation-sensitive material on a first major surface of a solid-state substrate;
   providing a first mask having a first pattern for defining locations on said radiation-sensitive material;
   exposing said radiation-sensitive material to radiation through said mask pattern in a first exposure step to define locations for localized processing at said substrate surface while maintaining said mask and said substrate in a substantially planar condition;
   then locally processing said substrate to fabricate the device in a process which causes dimensional distortion of siad substrate surface in the plane of the substrate surface;
   providing further radiation-sensitive material on said major surface;
   adjusting the relative sizes of the area of said substrate surface and the area of said second mask in a substantially uniform manner; and
   then exposing said further radiation-sensitive material to radiation in a second exposure step through a second mask pattern in a second mask to define further locations for localized processing at said substrate surface, said relative size adjustment being in such a direction as to reduce the misalignment in the relative locations defined by said first and second exposure steps resulting from said planar dimensional distortion.

2. A method as claimed in claim 1, in which at least part of said dimensional distortion is caused by elastic strain produced in an underlying part of said substrate by a layer provided adjacent at least one major surface of said substrate.

3. A method as claimed in claim 2, in which before said first exposure step insulating layers are formed at both the first major surface and an opposite major surface of the substrate, and between the first and second exposure steps the insulating layer at said opposite major surface is removed to leave said layer at said first major surface.

4. A method as claimed in claim 3, in which the first exposure step serves to define the location for a window in said layer at said first major surface, the insulating layer at said opposite major surface being removed while providing said window by locally removing part of said layer at said first major surface.

5. A method as claimed in claim 2, in which said substrate is of silicon at least adjacent said first major surface, and said layer is provided by oxidation of said silicon surface.

6. A method as claimed in claim 5, in which said silicon surface is oxidized to form said layer to a thickness of at least 0.5 micron.

7. A method as claimed in claim 1, in which said substrate comprises semiconductor material for the manufacture of a semiconductor device, and between the first and second exposure steps a dopant is introduced into the semiconductor substrate and causes at least part of said dimensional distortion.

8. A method as claimed in claim 7, in which said dopant is introduced into said first major surface at locations defined by said first exposure step and into the whole of the opposite major surface.

9. A method as claimed in claim 7, in which at least $2 \times 10^{16}$ phosphorus atoms per sq. cm. are locally introduced into said substrate as said dopant.

10. A method as claimed in claim 7, in which at least $10^{16}$ boron atoms per sq. cm. are locally introduced into said substrate as said dopant.

11. A method as claimed in claim 1, in which said dimensional distortion is sufficient to cause the largest transverse dimension of said substrate surface to change by more than 0.1 micron between the first and second exposure steps.

12. A method as claimed in claim 1, in which said relative sizes of the second mask and substrate are adjusted by maintaining at least one of the mask and substrate at a different temperature during different exposure steps.

13. A method as claimed in claim 12, in which during the exposure steps the substrate is maintained on a thermally-conductive mount having associated heating means for permitting the substrate to be maintained at different temperatures.

14. A method as claimed in claim 13, in which the heating means associated with said mount are required by control means to permit the temperature of said mount to be brought to a value determined by an adjustable setting of said control means.

15. A method as claimed in claim 13, in which, when the substrate is present on said mount, detector means associated with said mount develop a signal indicative of said dimensional distortion, and the heating means associated with said mount are regulated by control means which have an input for said signal and permit the temperature of said mount to be brought to a value determined by said signal.

16. A method as claimed in claim 15, in which the substrate has alignment markers which are spaced apart on said first major surface and generate an X-ray signal when aligned with corresponding areas of the incident electron image pattern, said X-ray signal being detected by X-ray detectors which are associated with said mount and provide in response to the X-ray signal an electrical signal input to said control means.

17. A method as claimed in claim 1, in which the first and second exposure steps comprise projecting an electron image pattern onto electron-sensitive material at said substrate surface.

18. A method as claimed in claim 1, in which the first and second exposure steps comprise exposing X-ray sensitive material at said substrate surface to an X-ray image pattern.

19. A method as claimed in claim 1, in which the first and second exposure steps comprise exposing photosensitive material at said substrate surface to an ultra-violet radiation pattern.

20. A method as claimed in claim 1, in which each mask pattern comprises an array of identical sub-patterns so that said localized processing is effected at an array of locations to form an array of identical devices on the substrate.

21. A method as claimed in claim 1, in which said processing causing said dimensional distortion also causes distortion of the plane of said substrate, and during said second exposure step the plane of said substrate is held substantially flat by clamping the substrate against a mount.

22. A method as claimed in claim 21, in which the substrate and mount comprise electrically conductive material, and the substrate is clamped against a dielectric layer on the mount by an electrostatic force resulting from the application of a potential difference between the substrate and the mount.

* * * * *

UNITED STATES PATENT AND TRADEMARK OFFICE
CERTIFICATE OF CORRECTION

PATENT NO. : 4,256,829

DATED : March 17, 1981

INVENTOR(S) : PETER J. DANIEL

It is certified that error appears in the above—identified patent and that said Letters Patent is hereby corrected as shown below:

Claim 1, line 14, "siad" should be --said--

Claim 14, line 2, "required" should be --regulated--

Signed and Sealed this

Eighteenth Day of October 1983

[SEAL]

Attest:

GERALD J. MOSSINGHOFF

Attesting Officer

Commissioner of Patents and Trademarks